United States Patent [19]
Bossaert et al.

[11] Patent Number: 5,384,602
[45] Date of Patent: Jan. 24, 1995

[54] DEVICE FOR THE FILTERING OF A VIDEO SIGNAL

[75] Inventors: Jean Bossaert, Ablis; Philippe Bodelet, Arpajon; Thierry Tomietto, Chatillon, all of France

[73] Assignee: GE Medical Systems S.A., Buc, France

[21] Appl. No.: 74,438

[22] Filed: Jun. 9, 1993

[30] Foreign Application Priority Data

Jun. 10, 1992 [FR] France .................. 92 07004

[51] Int. Cl.⁶ .......................................... H04N 5/208
[52] U.S. Cl. ...................................... 348/628; 348/446
[58] Field of Search ................ 358/166, 110, 37, 140;
H04N 5/208, 7/01; 348/448, 446, 628, 606

[56] References Cited

U.S. PATENT DOCUMENTS

| | | | |
|---|---|---|---|
| 4,021,673 | 5/1977 | Bossaert | 250/439 R |
| 4,551,679 | 11/1985 | Bossaert | 324/309 |
| 4,639,782 | 1/1987 | Fujita et al. | 358/166 |
| 4,792,760 | 12/1988 | Jacob et al. | 324/322 |
| 4,831,435 | 5/1989 | Song et al. | 358/160 |
| 5,055,791 | 10/1991 | LeRoux et al. | 324/318 |
| 5,241,372 | 8/1993 | Ohba | 358/166 |

FOREIGN PATENT DOCUMENTS

| | | | |
|---|---|---|---|
| 0444341 | 9/1991 | European Pat. Off. | H04N 5/44 |
| 0471959 | 2/1992 | European Pat. Off. | H04N 5/44 |
| WO88/00340 | 1/1988 | France | H04N 5/44 |
| WO88/09926 | 12/1988 | France | G01N 24/04 |

Primary Examiner—Victor R. Kostak
Assistant Examiner—Jeffery S. Murrell
Attorney, Agent, or Firm—Nilles & Nilles

[57] ABSTRACT

To filter a signal delivered in interleaved form, there is provision for the introduction, in series, of a filter on half frames having a bandpass transfer function on the horizontal plane and a high-pass transfer function on the vertical plane. It is shown that this filter then carries out a general bandpass transfer function on the total image signal. Steps are taken to make the center frequency of this filter correspond to a desired resolution of the image. It is shown then that by acting in this way it is possible to heighten the contours of the structures. The invention can be applied particularly to medical radiography.

20 Claims, 3 Drawing Sheets

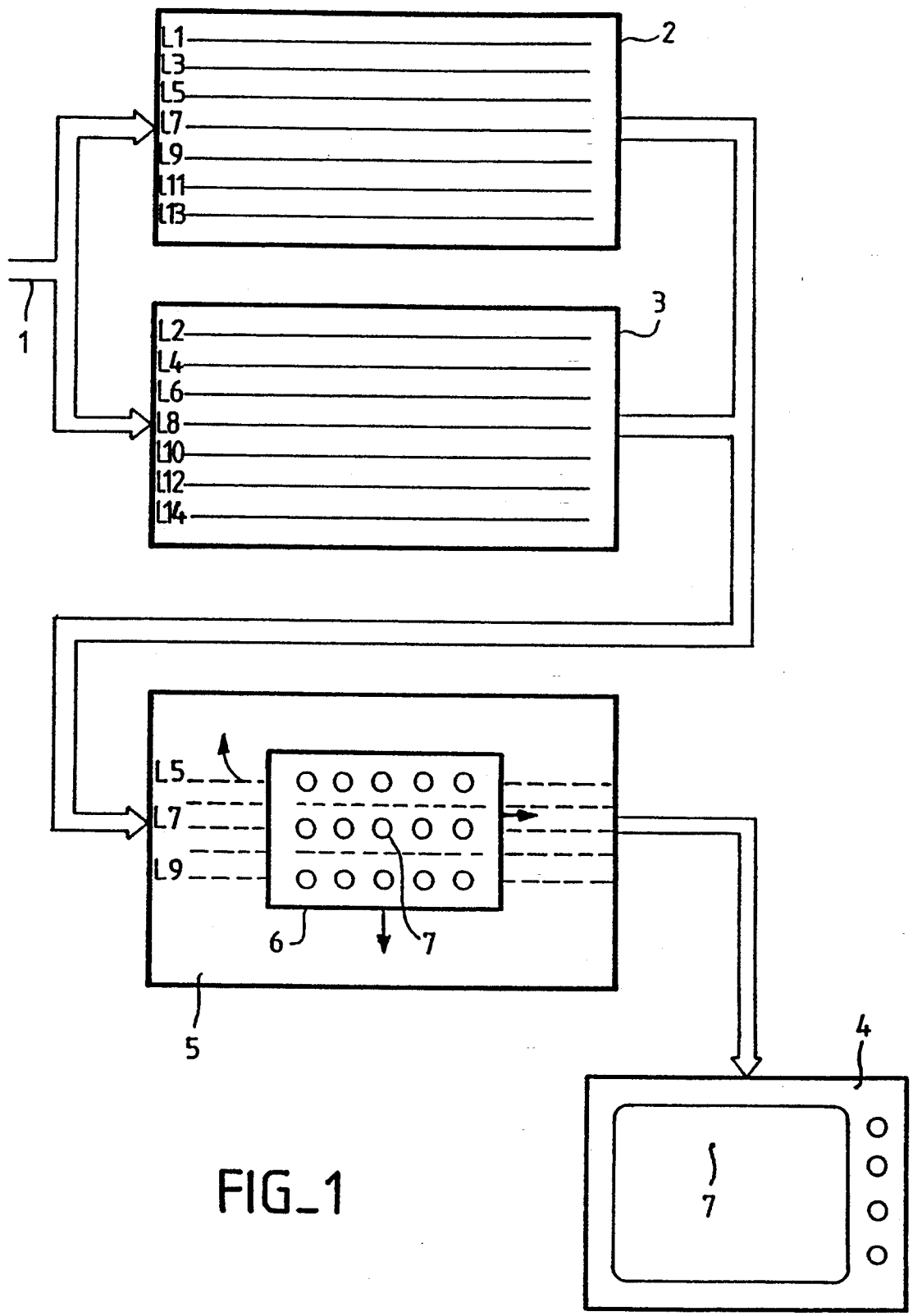
FIG_1

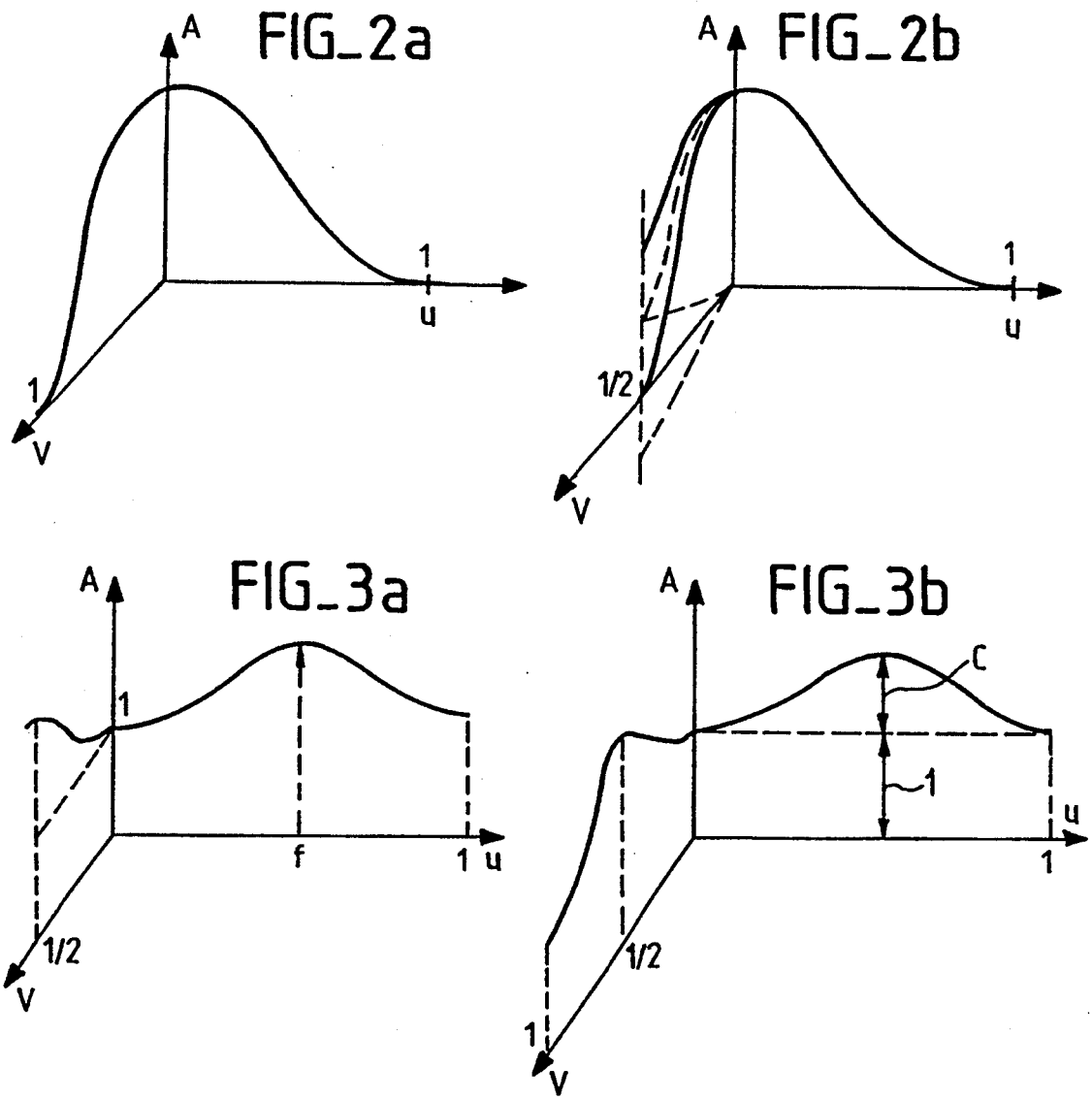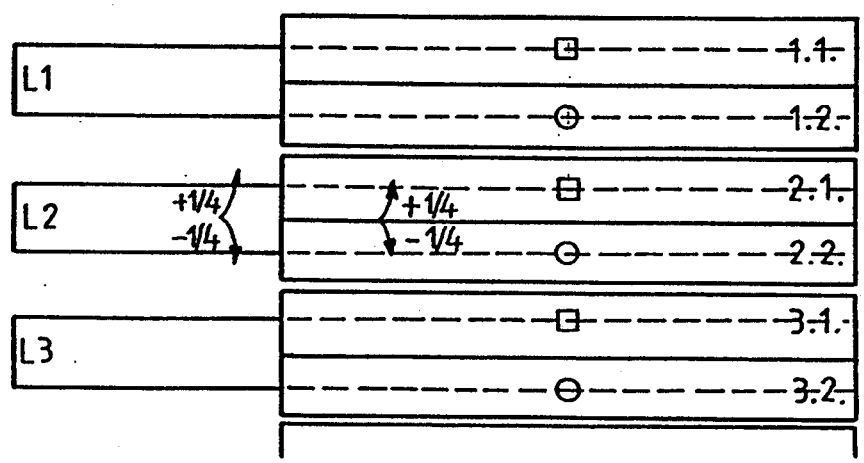

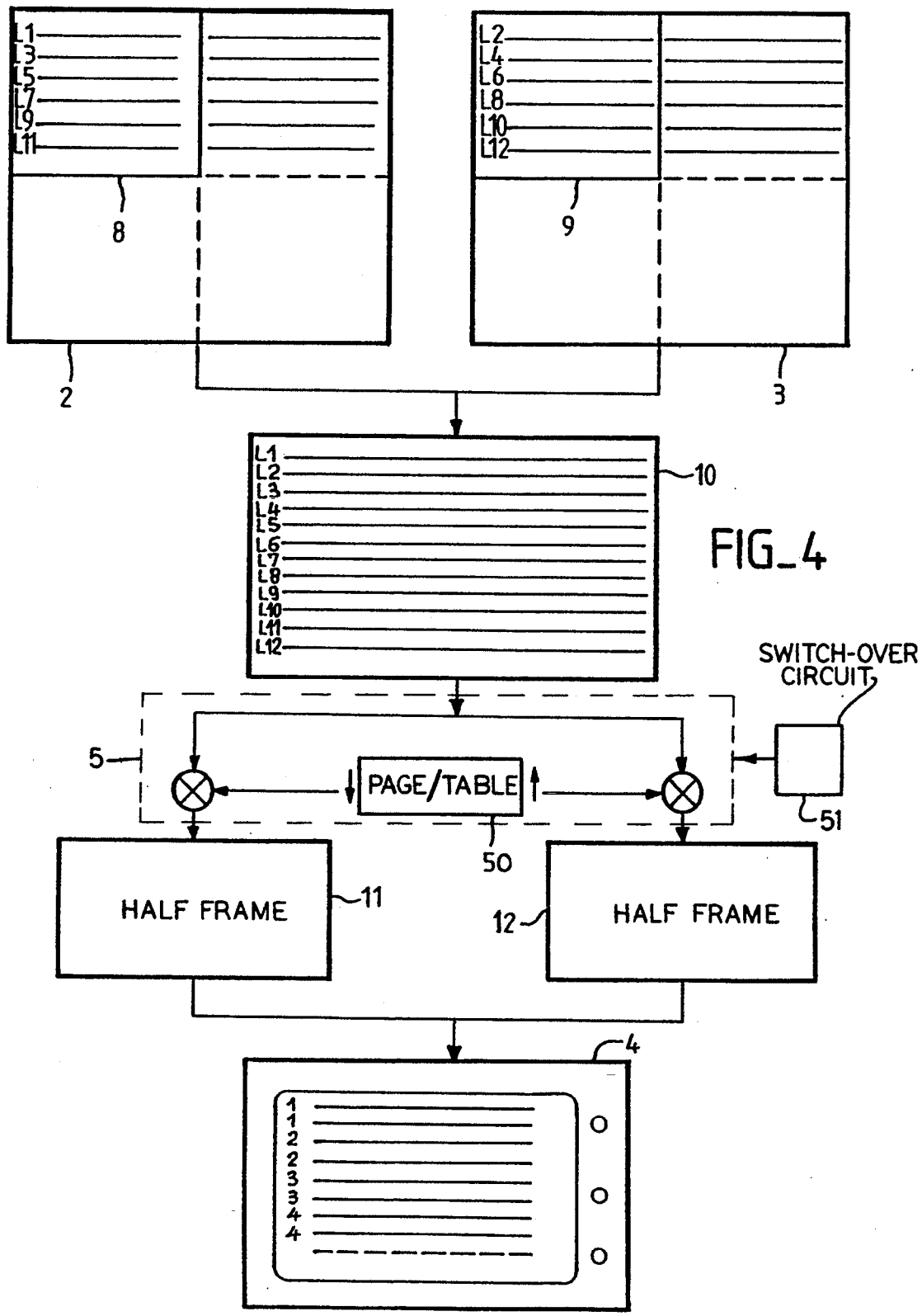
FIG_4

DEVICE FOR THE FILTERING OF A VIDEO SIGNAL

BACKGROUND OF THE INVENTION

An object of the present invention is a device for the filtering of a video signal that can be used notably to carry out the contour correction, or magnification, of an image displayed on a monitor. It can be applied especially in medicine, where it can be used for the processing of digitized images from radiography operations.

When a body to be examined, for example that of a patient, is subjected to a radiography, the X-rays that go through this body are absorbed, to varying degrees, by the cells of this body interposed in their path. The intensity of the X-radiation that reaches a point downline at a detector reveals the nature of these cells. There are known ways of recording the signal revealed by the detector in the form of a video signal and of showing it on a monitor. In practice, to carry out signal processing operations on this signal, it is preferred to pass from a detected analog video signal to a digital video signal with analog-digital converters. For the display, the digital video signal is reconverted into an analog signal (with digital-analog converters).

One of the defects of radiological images is that the X-radiation, in crossing the cells, sometimes gives rise to secondary emissions. These secondary emissions, which too are detected by the detector, constitute degradations of the image since they convey artefacts that make the image fuzzy at different points of the image. Normally, in a radiological image, the big structures, which correspond in practice to low spatial frequencies, are well distinguished. By contrast, the small details, which correspond to high spatial frequencies, are then subdued. In particular, the contours of the structures shown, corresponding to sudden transitions of the image signal, depending on whether the contour pertains to a projection that is plumb with one mass or with another different one, are toned down. Another effect strongly diminishes the contribution of the high spatial frequencies of the spectrum. It arises out of the fact that an X photon received by the detector does not give a luminous point but a spot. Indeed, the incident X photon produces secondary X photons and electrons. The dispersal of these secondary photons and electrons in the scintillator material of the detector produces light photons distributed on a spot having a non-negligible dimension. This light spot is the detected signal. Because of these phenomena, the radiological images all undergo a swift decrease of the amplitudes of the spectral components with the frequency.

It is therefore sought naturally to heighten the contours: it is sought to increase the participation in the video signal of certain spectral components located in the top part of the spectrum. This heightening is obtained by a filtering operation.

The performance of this filtering, however, always comes up against a difficulty specific to video images: normally, the signal of these video images is presented with an interleaving of the lines so as to prevent the scintillation effect which is bothersome when viewing an image. Hence, half frames are distinguished, called even-parity frames and odd-parity frames: they are displayed successively on the monitor, generally at a rate of fifty half frames per second, giving a standardized rate of twenty-five images per second for the total image. The notion adopted here will be the commonly used one of the half frame whereas the exact term would be half image. Normally, to be filtered, the interleaved signal must be converted into a progressive signal.

Indeed, the most convenient filters are the convolution filters. The following is the principle of these filters. In a 2D window of the image, a certain number of contiguous picture elements or pixels are identified and the pixel located at the center of the window is assigned a luminosity that depends on the luminosity of this pixel at the center of the window as well as the luminosities of the pixels contiguous to this pixel in this window. This dependence is expressed by a set of coefficients: in practice, the luminosity at the center is an accumulation of the luminosities of the contiguous pixels weighted by coefficients. The processing operation consists theoretically in having luminosities of the contiguous pixels available and in making them bear this algebraic combination. All the same, access must be had to the contiguous pixels. This is why the signal has to be progressive.

A convolution is normally a combination in which all the pixels of an image contribute with an adequate weighting to the filtered luminosity of each of the pixels of the image. However, to limit the computations and hence the processing time of the computers that implement these processing algorithms, it is assumed that it is possible to limit the domain of convolution to a small number of contiguous pixels. Thus 9-pixel domains are known where, in a 3×3 pixel matrix, the luminosity of the central pixel is a function of its 8 neighbors. Similarly, there also exist known 25-pixel domains, corresponding to a 5×5 pixel window. Preferably, the matrices are odd-parity type matrices because a center of the window can be defined more easily without its being necessary to offset the image. However, the invention could be applied to even-parity matrices, 4×4 pixels for example.

When the video signal of a half frame is delivered, it is of course only the even-parity lines or the odd-parity lines that are available. Consequently, the neighborhood that is obtained naturally is an imperfect neighborhood. In particular, because the lines most contiguous to the central line are not present. In practice, if it is sought, all the same, to filter this signal with a convolution filter, the processing obtained for the contours is different depending on whether these contours have a substantially vertical trace or a substantially horizontal trace in the image. For the horizontal trace, given the fact that the filter naturally uses the pixels directly contiguous to the central pixel of the window, there is obtained a resolution that is twice the resolution that can be obtained in the vertical plane. Indeed, the operation is carried out, in this case, on pixels that are twice as much packed together.

One attempt to overcome this drawback consists in using windows of 5×5 five theoretical pixels with, in practice, 5×3 real pixels since two lines are absent, and in achieving a symmetrical neutralization, by null coefficients, of the luminosities of the pixels located in columns that are directly adjacent to the center of the window. Experience has unfortunately shown that the result obtained is not good. Indeed, in this case, the highest spatial frequency filtered can only be half of the desired frequency. In practice, convolutions are obtained that are of the same type as the convolutions taken in 3×3 pixel domains but with additional constraints that lower the spatial resolution.

Normally, the transfer function of the filter should be a bandpass function to enable the accentuation of the central spatial frequencies corresponding to a given resolution. In the high frequencies, the filter has to be attenuated to eliminate the effects of the electronic noises, and so as not to excessively amplify a signal whose high frequency components have low amplitudes with respect to the noise. This is true for the entire image.

In the invention, in studying the spatial frequency spectra corresponding to each of the half images, it has been realized that a definitely acceptable result is obtained if the video signal, delivered interlaced in the form of a half frame, is subjected quite simply to a filtering operation with a high-pass transfer function on the vertical plane and a bandpass transfer function on the horizontal plane. In practice, the spectral aliasing obtained with the filter gives a result that is slightly less satisfactory than with a 5×5 filtering in progressive mode. The result thereof is a slight calculated degradation of the signal-to-noise ratio that is equal to some percentile points and is neither visible nor measurable and is therefore not troublesome. By carrying out a filtering on half frames, given that the recomposition of the image on the screen by interleaving of the half-frames inverts one spectrum in relation to the other, ultimately for the vertical direction there is also obtained a bandpass filtering whose center frequency corresponds to the resolution to be obtained on the vertical plane, which is then preferably the same as the horizontal plane.

This same spectral study has furthermore led to the making of a magnification filtering to show a high-quality magnified image. Indeed, to magnify an image, for example to double it, the method uses a quarter of the initial image (a quarter of the even-parity half frame and a quarter of the odd-parity half frame) and four pixels of the image to be shown are replaced by pixels of the initial image. Rather than taking pixels as such, it is possible to choose to interpolate. Normally, the interpolation is not done in the prior art techniques because, strictly speaking, in a duplicated line of a half frame it is necessary to interpolate the luminosities of the pixels of this duplicated line as a function of the pixels of the same line in the same half frame and pixels of another line in another half frame, with opposite parity, located above or below. In the invention, with a same type of filter, it is also possible to resolve this problem.

OBJECTS AND SUMMARY OF THE INVENTION

An object of the invention therefore is a device for the filtering of a video signal delivered in an interleaved form by successive half frames, characterized in that said device comprises a filter having a high-pass transfer function on the vertical plane in series in a circuit for the transmission of this video signal, in order to obtain the equivalent of a bandpass filter in progressive mode and thus achieve a contour correction.

An object of the invention is also a device for the magnification of a part of the image contained in a video signal, delivered in an interleaved form by successive half frames, characterized in that said device comprises:
- a circuit for the combination, in progressive mode, of the lines of this video signal corresponding to a reduced height of the image to be represented in a magnified state,
- an interpolation filter in series in a circuit for the transmission of this progressive signal, to interpolate the values of the lines of this signal,
- and a switch-over circuit to transmit the progressive signal twice, once in fulfilling the role of an even-parity half frame and once in fulfilling the role of an odd-parity half frame, and to modify filtering coefficients of the filter at each change of a half frame.

BRIEF DESCRIPTION OF THE DRAWINGS

The invention will be understood more clearly from the following description and from the accompanying figures. These figures are given purely by way of an indication and in no way restrict the scope of the invention. Of these figures:

FIG. 1 is a drawing showing the principle of the filtering according to the invention;

FIGS. 2a, 2b and 3a, 3b depict the shapes of the spectra respectively of an image signal and of the video signal of a half frame, of the filter according to the invention acting on the half frame, and the equivalent result of the filter of the invention acting on the total image;

FIG. 4 is a drawing showing the principle of the magnification filtering according to the invention;

FIG. 5 shows a drawing of the combination of the lines of the half frames during the magnification of the image.

DETAILED DESCRIPTION OF THE PREFERRED EMBODIMENTS

FIG. 1 shows the principle of the invention. A video signal 1 takes the form of two half frames respectively 2 and 3, that are odd-parity and even-parity half frames. These two half frames are sent one after the other to a display monitor 4 where they are shown interleaved with each other. In the invention, each half frame is processed by a single filter 5 placed in series in the circuit for the transmission of this video signal. In the example described, the filter 5 is a convolution filter of the Cascading IMS type marketed by the firm INMOS, England. This signal is capable, in practice, of storing in digitized form the equivalent of a little more than two lines of the video signal belonging to a same half frame. For example, it could stock the luminosity values of the pixels of the lines L5, L7 and L9. As and when a new current pixel is added to the memory, pertaining to the line L9, a current pixel pertaining to the line L5 can be relinquished.

It can therefore be considered that, at any time, the circuit 5 has, in memory, the luminosities of the pixels located between the pixel that has just been introduced and the pixel that has just been ejected. Among these pixels, it is possible to identify a window such as the window 6 which, in one example, pertains to the three lines L5, L7 and L9. The pixels all neighbor one another in these three lines.

The current window 6 gets shifted horizontally, from the start of a line to the end of a line, and vertically by one line whenever a whole line has been completely read. There are known ways, by means of switching and addressing circuits, of having the luminosity values of the pixels located in the window 6 permanently available.

The pixel 7, located at the center of the window 6, receives as a luminosity value to be displayed on the screen of the monitor 4, a luminosity which is a function of its five neighbors represented by small circles in the window 6. It will be noted that the direct neighbors located in the even-parity lines L6 and L8 are not taken into account (since ultimately they will be introduced into the circuit 5 only when this circuit processes the half frame 3) but also that the five pixels in each line L5, L7, L9 of the window are taken into account with non-null coefficients.

An explanation shall now be given of the filtering functions. A low-pass filtering operation is aimed at attenuating the noise and the fast uneven features of the image, which are faster than the details that are to be preserved.

In practice, it is necessary to choose a compromise between the improvement of the noise and the preserving of the significant details. For example, in a 3-pixel×3-pixel window, it is possible to have a combination of the following type:

$$1/16 \cdot \begin{vmatrix} 1 & 2 & 1 \\ 2 & 4 & 1 \\ 1 & 2 & 1 \end{vmatrix}$$

A smoothened image is then obtained. In order not to change the mean level of the image, the common practice is to standardize the matrix of the response by dividing it by the sum of the coefficients, whence the presence of the factor 1/16.

The purpose of a high-pass filter is to amplify the high spatial frequencies. It contributes to heightening the contours. A result such as this can be obtained by taking the difference between the initial image and the smoothened image. The two images may be weighted if necessary. One example takes an initial image multiplied by 20 (each luminosity value at pixels is multiplied by twenty). This corresponds in practice to a convolution function of the following type:

$$\begin{vmatrix} 0 & 0 & 0 \\ 0 & 20 & 0 \\ 0 & 0 & 0 \end{vmatrix}$$

The resultant high-pass filter then has, as a combination coefficient, the following results:

$$\begin{vmatrix} 0 & 0 & 0 \\ 0 & 20 & 0 \\ 0 & 0 & 0 \end{vmatrix} - \begin{vmatrix} 1 & 2 & 1 \\ 2 & 4 & 2 \\ 1 & 2 & 1 \end{vmatrix} = \begin{vmatrix} -1 & -2 & -1 \\ -2 & 16 & -2 \\ -1 & -2 & -1 \end{vmatrix}$$

In practice, this latter convolution is standardized by a factor ¼.

With 3×3 windows, all that can be made is low-pass filters or high-pass filters. The transfer function is monotonic. The 5×5 windows offer greater flexibility than the 3×3 windows for the making of a filter. In particular, with them it is possible to obtain bandpass filters which are precisely those that to be obtained in the invention.

The study of the invention, which has led to the making of a bandpass filter in the horizontal plan and a highpass filter in the vertical plane is therefore compatible with this theory since there are only three lines on the vertical plane.

In practice, to obtain an operator that performs the same processing operation on both dimensions of the image, it is enough in a preferred mode to compute an operator the effect of which is a high-pass filter in the vertical plane corresponding to half of the bandpass filter in the horizontal plane. It is thus possible to determine a family of operators with a single parameter. This parameter is the boosting of the center frequencies of the bandpass filter. For this parameter, the value chosen is the one that gives the best result in terms of contour heightening. The constraint related to the processing by half frame is then no longer troublesome.

FIG. 2a shows the spectrum of the image signal. This figure naturally shows low frequencies in the horizontal plane (U) and the vertical plane (V) with the significant amplitudes, and high frequencies on these two normally attenuated axes. FIG. 2b shows the spectrum of the video signal of each half frame corresponding to the image signal of FIG. 2a. On the horizontal plane, nothing has changed.

On the contrary, on the vertical plane, owing to the half sampling, the high frequencies of the basic signal (shown in dashes) have got positively or negatively aliased in the half band of the spectrum. They are positively or negatively aliased depending on the parity of the frame. We then obtain one of the two spectral shapes shown in a solid line for the vertical spatial frequencies in FIG. 2b.

FIG. 3a shows the graph of the spectrum of the filter according to the invention. On the horizontal plane, this filter has an over-oscillation corresponding to a spatial frequency f which itself corresponds to the resolution that is to be improved. The idea of the invention is to make a high-pass filter for the vertical mode having the transfer function shown in FIG. 3a. For the low frequencies, the transfer function is 1 and for the high frequencies, greater than or equal to the frequency f, it reaches the over-oscillation value C+1.

FIG. 3b shows the real result of the filter on the total image signal of FIG. 2a. When the two half frames are combined together, it amounts to overturning the vertical filter which turns from a high-pass filter into a low-pass filter.

The over-oscillation C or contour heightening coefficient, is compared with the basic amplitude of the signal. The ratio of reinforcement of the central frequencies is therefore equal to C+1. In practice, C may vary from zero to some units. The following table gives the coefficients of the filter as a function of the coefficient C:

| | | | | |
|---|---|---|---|---|
| $-C/32$ | $-C/16$ | $-C/16$ | $-C/16$ | $-C/32$ |
| $-3C/16$ | $C/8$ | $1 + 5C/8$ | $C/8$ | $-3C/16$ |
| $-C/32$ | $-C/16$ | $-C/16$ | $-C/16$ | $-C/32$ | where C represents the over-oscillation of the filter. These coefficients are to be applied as a multiplicative weighting to the luminosities of the pixels of the window 6 which participate in the preparation of the filtered luminosity of the pixel 7. They parametrize the circuit referred to here above. We have examined the case of a three-line processing system with five pixels per line. With a costlier circuit that performs better than the one referred to, it is possible to process five lines (even or odd) and nine pixels per line. Ultimately, n lines will be processed (n preferably being an odd number) and 2n-1 pixels will be processed per line. This is valid even if n is an even number.

To obtain a magnification of the image by a factor of 2, it is necessary to use a quarter of the initial image: it is necessary to re-read the quarter of the memory corresponding to the useful part of the image. This is shown in FIG. 4 where the total image is represented by the two memorized half frames 2 and 3 and where quarters of half frames 8 and 9 respectively are taken. To simplify the explanation, quarters of half frames fixed at the top and left of the image are taken. Naturally, however, these quarters of half frames can be taken at any place in the half frames 2 and 3, provided that they are taken at places that correspond to one other.

In a first processing operation, the half lines of each of these quarters of half frames are composed to constitute a quarter image 10 in which the lines are shown in progressive mode. The quarter image 10 can be stored in an intermediate memory and, preferably, it will be sent as such, in progressive mode, into the filter 5 of the invention.

Taking up the elements of FIG. 1 again, it can be assumed that the filter will thus receive the lines whose numbers follow one another, for example L1, L2, L3 and that there will always be the equivalent of two lines (plus five pixels) permanently stored therein.

To prepare a first half frame (odd-parity) 11 of the video signal to be shown on the monitor 4, the filter 5 will be weighted by a given set of coefficients. It will be shown hereinafter that, to prepare the lines of the other half frame (even-parity) 12, it will be enough to overturn the coefficients of the filter and redo a reading in progressive mode of the quarter image 10 or quarters 8 and 9 of the odd-parity half frames 2 and even-parity half frames 3 if it is not sought to use any memory to store the intermediate image 10.

This shall be explained with reference to FIG. 5. This figure shows three half lines, the half lines corresponding to the lines L1, L2, L3 on the left-hand side. Each of these half lines has to be converted into two full lines including the number of pixels to be shown on the total width of the screen of the monitor 4. Roughly, the information content of the half line L1 must be borne in the line 1.1 and in the line 1.2, just as that of the half line L2 must be borne in the line 2.1 and in the line 2.2. It shall be assumed hereinafter that the lines 1.1, 2.1, 3.5 etc. are odd-parity lines referenced by a small square while the lines 1.2, 2.2 and 3.2 are even-parity lines referenced by a small circle.

The invention makes use of the presence of the filter to carry out, in addition, an interpolation. One of the useful features of the invention then is that only one circuit is required and that it enables the entire processing to be done in real time. It can be seen however that the interpolation differs according to the parity of the frame. For example, the line L2 is offset differently, depending on whether it is necessary to prepare the line 2.1 which is very close to the line L1 or the line 2.2 which is very close to the line L3. When the lines 1.1 or 2.1 or 3.1 etc. are to be prepared, the interpolation filter will take account of the lower-order original line L1 to interpolate with this line (L2). On the contrary, to prepare the lines (1.2) of the half frame of the other parity, it will be necessary to take account of the higher-order line (L3): quite simply, the coefficients of the filter have to be inverted.

When the half line L1 is read, each pixel has to be duplicated to fill an entire line (1.1 or 1.2) with only half of the original line. This can be done on the fly either at the time of the production of the image in progressive mode 10 or when the memory of the filter 5 is loaded. It is enough quite simply to write each of the pixels of the original line L1 twice in succession in this memory. The convolution must produce the two half frames starting from this single (progressive) frame. The coefficients of the convolution operator are then changed between the production of the two half frames, to obtain two complementary half frames. The switch-over circuit 5 used, of the type described here above, therefore has two pages 5 of coefficients that enable the change to be made while an image is being displayed. The functions of this circuit include:

a) the offsetting of the two half frames (offset and interpolation columnwise): consequently, it may be that the duplication is not sudden;

b) the interpolation of the pixels in the line;

c) the contour correction, as the case may be, if it is desired to carry it out at the same time.

This contour correction, for its part, keeps the symmetry. Since the offsets of the half frames are opposite, it is enough to compute a page or table of coefficients for only one direction of offset. The second direction is then obtained by reversing the furthermost lines of the table. In practice, a 15-coefficient page or table will be obtained, as in the previous case where, to go from one half frame 11 to the other one 12, it will be necessary to read the page or table from bottom to top instead of reading from top to bottom.

Let L and L* be the operators corresponding to the two convolutions used to achieve the interpolation and the contour correction. The total operator is computed by means of translations $J_u$ and $J_v$ in each direction, horizontal and vertical respectively. Let $J_v$ and $J_v^*$ be the operators for the physical translations by $+/-\frac{1}{2}$pixel due to the offset of the half frames: the corresponding two convolutions will be represented by two conjugate operators L and L*. The operator applied between the composite frame and the final image is $J_v.L + J_v^*.L^*$.

A real operator Z (without offset) is obtained between the original image and the magnified image which must carry out the interpolation plus the contour correction. Let $Z=(J_u+J_u^*)(LJ_v+L^*J_v^*)$ where $J_u$ and $J_u^*$ represent the effect of duplication of the pixels in each line. There is thus defined a filter that is organized such that Z corresponds to the conditions laid down here above. The physical expression of these conditions relating to the operator Z is a bandpass filtering, the transmission factor of which is 1 at the low frequencies, C at an intermediate frequency and 0, with a horizontal tangent, for the maximum Nyquist frequency.

In the space of the phases, J is written as follows:
$J(v)=e^{-j\pi v/2}$

The development on the reference u, v leads to a form:

$Z(u,v) =$ $$\sum_{p=0}^{2} \cdots \sum_{q=0}^{2} C_{pq} \cos(\pi(2p+1)u/2) \cdot \cos(\pi(2q+1)v/2)$$

The table $C_{pq}$ comprises 9 terms related to the coefficients $a_{ij}$ of the operation by simple linear relationships.

$$C_{pq} = a_{ip} + a_{i(p+1)} \quad \text{with} \quad \begin{aligned} i &= 0 \text{ if } q = 0 \\ i &= (-1)^q \text{ if } q \neq 0 \end{aligned}$$

The operator is examined more easily in the table $C_{pq}$ for which the following conditions are laid down:
1. Standardization $\Sigma C_{pq} = 1$
2. Interpolation which gives six relationships of the form $\Sigma_p (-1)^p (2p+1) C_{pq} = 0$ five of which are independent. This relationship enables the computation of six coefficients as a function of the other three coefficients.

Furthermore and preferably, additional constraints are laid down: the maximum value given in all direction of the plane u, v and existence of only one maximum. An optimization program using the least error squares method has been achieved on the additional conditions. Its operation is as follows: a table $a_{ij}$ is given, providing an approximate solution of the coefficients and the program makes a search, by successive approximations, for the best solution meeting the conditions laid down. The search is made along the line with the greatest slope towards the minimum of the error squares, in the space of the independent parameters.

The general solution found for the operator L is then a linear form as a function of only one parameter:

$$\alpha = \begin{array}{ccccc} -15/512 & 5/128 & 35/256 & 5/128 & -15/512 \\ -15/256 & 15/64 & 75/128 & 15/64 & -15/256 \\ -3/512 & -3/128 & -9/256 & -3/128 & -3/512 \end{array}$$

and $$\beta = \begin{array}{ccccc} -5/64 & -1/16 & 1/32 & -1/16 & -5/64 \\ -5/32 & 1/8 & 9/16 & 1/8 & -5/32 \\ -1/64 & -1/16 & -3/32 & -1/16 & -1/64 \end{array}$$

and where C is the contour heightening parameter. In the useful domain, C varies between 0 and some unities. When C=0, only the interpolation is done without any contour heightening. When C=1, a contour heightening of the order of 1.55 is obtained. Preferably, C ranges from 0 to 1.

For a half frame 11, the table is the one shown above. For the other half frame 12, the table is the same but with the furthermost lines of coefficients being transposed.

We claim:

1. A device for the filtering of a video signal delivered in an interleaved form by successive half frames made of video horizontal line signals, wherein said device comprises, in a circuit for the transmission of said video signal, a filter having a high-pass transfer function on a vertical dimension of an image signal resulting from a displaying of said video signal, in order to obtain a filtering operation equivalent to a filtering operation performed by a band-pass filter operating in progressive mode and thus achieving a contour correction, said high-pass transfer function providing for a transfer coefficient with a value 1 for frequencies lower than a frequency f and providing for a transfer coefficient with a value C+1 for frequencies at least as high a frequency as said frequency f, where C is an over-oscillation value.

2. A device according to claim 1, wherein said filter is a digital convolution filter which filters a digitized video signal relating to 2n-1 pixels of a line in n lines, n being an odd number.

3. A device according to claim 1, characterized in that the domain of convolution of said filter is a domain restricted to three lines, all even-parity or odd-parity depending on the type of half frame during filtering, and with five pixels per line.

4. A device according to claim 3, wherein the coefficients of said high-pass transfer function filter are of the type:

$$\begin{array}{|ccccc|} -C/32 & -C/16 & -C/16 & -C/16 & -C/32 \\ -3C/16 & C/8 & 1+5C/8 & C/8 & -3C/16 \\ -C/32 & -C/16 & -C/16 & -C/16 & -C/32 \end{array}$$

where C represents an over-oscillation of an equivalent band-pass filter in progressive mode.

5. A device according to claim 1, wherein the frequency cut off, f, of said filter is the same as the central frequency of an equivalent band-pass filter, which central frequency corresponds to the resolution to be obtained.

6. A device for the magnification of a part of an image contained in a video signal, said video signal being delivered in an interleaved form by successive half frames, said device comprising:

a combination circuit for a combination and a transmission, in progressive mode, of interleaved lines of said video signal corresponding to a reduced height of the image to be represented in a magnified state, a filter in series with said combination circuit for interpolating values of lines of said signal and for transmitting a progressive signal, and a switch-over circuit which drives said filter in order to transmit the progressive signal twice, once in which said filter fulfills an interpolating role for an even-parity half frame and once in which said filter fulfills an interpolating role for an odd-parity half frame, said driving of said filter comprising transposing lines of filtering coefficients of said filter at each change of half frame to be sent for displaying.

7. A device according to claim 6, wherein said filter has a high-pass transfer function and is organized so that the total filtering obtained in the image is a band-pass filter with interpolation.

8. A device according to claim 7, wherein said video signal is digitized and said filter is a digital convolution filter, the convolution domain of which is a domain restricted to three lines, all even-parity or odd-parity depending on the type of half frame being filtered, and with five pixels per line.

9. A device according to claim 8, wherein the coefficients of said high-pass transfer function are of the $\alpha + C/\beta$ type, where:

$$\alpha = \begin{array}{|ccccc|} -15/512 & 5/128 & 35/256 & 5/128 & -15/512 \\ -15/256 & 15/64 & 75/128 & 15/64 & -15/256 \\ -3/512 & -3/128 & -9/256 & -3/128 & -3/512 \end{array}$$

where $$\beta = \begin{vmatrix} -5/64 & -1/16 & 1/32 & -1/16 & -5/64 \\ -5/32 & 1/8 & 9/16 & 1/8 & -5/32 \\ -1/64 & -1/16 & -3/32 & -1/16 & -1/64 \end{vmatrix}$$

and where C, which represents the over-oscillation of the central frequencies of the band-pass filter, has a value ranging from zero, when it is not sought to make any contour correction, to one, when contour correction is applied.

10. A method comprising:
transmitting a video signal to a monitor, said video signal being delivered in interleaved form by successive half frames composed of video horizontal line signals; and
filtering said video signal, during said transmitting step, using a filter having a high-pass transfer function on a vertical dimension of an image signal resulting from a display of said video signal, thereby obtaining a filtering operation which is the equivalent of a filtering operation performed by an equivalent band-pass filter in progressive mode and achieving a contour correction, said high-pass transfer function providing for a transfer coefficient with a value 1 for frequencies lower than a cut-off frequency f and providing for a transfer coefficient with a value C+1 for frequencies at at least as high as said frequency f, where C is an over-oscillation value.

11. A method according to claim 10, wherein said filtering step comprises filtering a digitized video signal relating to 2n-1 pixels of a line in n lines, n being an odd number.

12. A method according to claim 11, wherein said filtering step is performed by a digital convolution filter having a domain restricted to three lines, all even-parity or odd-parity, depending on the type of half-frame being filtered, and all with five pixels per line.

13. A method according to claim 12, wherein the coefficients of said high-pass transfer function filter are of the type:

$$\begin{vmatrix} -C/32 & -C/16 & -C/16 & -C/16 & -C/32 \\ -3C/16 & C/8 & 1+5C/8 & C/8 & -3C/16 \\ -C/32 & -C/16 & -C/16 & -C/16 & -C/32 \end{vmatrix}$$

where C represents an over-oscillation of an equivalent band-pass filter in progressive mode.

14. A method according to claim 10, wherein said frequency f is the same as the central frequency of said equivalent band-pass filter, said central frequency corresponding to a resolution to be obtained.

15. A method according to claim 10, further comprising displaying said signal on said monitor.

16. A method of magnifying a part of an image contained in a video signal being delivered to a monitor, said video signal being delivered in an interleaved form by successive half frames, said method comprising:
combining and transmitting, in progressive mode, interleaved lines of said video signal corresponding to a reduced height of the image to be represented in a magnified state, said combining and transmitting step being performed by a combination circuit;
interpolating values of said lines and transmitting a progressive signal to said monitor using a filter in series with said combination circuit; and
driving said filter to transmit said progressive signal twice, once in which said filter fulfills an interpolating role for an even-parity half frame and once in which said filter fulfills an interpolating role for an odd-parity half frame, said driving step comprising transposing lines of filtering coefficients of said filter at each change of half frame sent to said filter from said combination circuit.

17. A method according to claim 16, wherein the total filtering obtained in said image is band-pass filtering with interpolation.

18. A method according to claim 17, wherein said combining and transmitting step comprises combining and transmitting a digitized video signal, and wherein said filtering step is performed by a digital convolution filter having a high-pass transfer function and a convolution domain restricted to three lines, all even-parity or odd-parity, depending on the type of half-frame being filtered, and all with five pixels per line.

19. A method according to claim 18, wherein the high-pass transfer function has a frequency cut-off f which is the same as the central frequency of a band-pass filter which operates in progressive mode and which provides a filtering function equivalent to the filtering function performed by an equivalent band-pass filter, said central frequency corresponding to a resolution to be obtained by said filtering step.

20. A method according to claim 16, wherein said combining and transmitting step comprises combining and transmitting a digitized video signal, and wherein the filtering step is performed by a digital convolution filter having a high-pass transfer function and a convolution domain restricted to three lines, all even-parity or odd-parity, depending on the type of half-frame being filtered, and all with five pixels per line.

* * * * *